United States Patent [19]

Statz et al.

[11] Patent Number: 4,937,473
[45] Date of Patent: Jun. 26, 1990

[54] SWITCHING STATE RETENTION CIRCUIT

[75] Inventors: Timothy V. Statz, Minneapolis; Robert L. Rabe, Maple Grove; Michael R. Hegre, Eden Prairie, all of Minn.

[73] Assignee: Honeywell, Inc., Minneapolis, Minn.

[21] Appl. No.: 254,342

[22] Filed: Oct. 4, 1988

[51] Int. Cl.$^5$ .............................. H03K 3/356
[52] U.S. Cl. ........................ 307/443; 307/272.2
[58] Field of Search ............ 307/443, 431, 452–453, 307/481, 572, 573–577, 579, 584, 545, 279, 272.2, 291

[56]     References Cited
          U.S. PATENT DOCUMENTS

| | | | |
|---|---|---|---|
| 3,980,897 | 9/1976 | Arnold | 307/205 |
| 4,367,420 | 1/1983 | Foss et al. | 307/453 |
| 4,507,574 | 3/1985 | Seki et al. | 307/448 |
| 4,558,237 | 10/1985 | Rabe et al. | 307/475 |
| 4,569,032 | 2/1986 | Lee | 364/787 |
| 4,569,067 | 2/1986 | Gallup | 307/272.2 X |
| 4,570,094 | 2/1986 | Griffin et al. | 307/452 |
| 4,777,388 | 10/1988 | Widener | 307/443 X |
| 4,833,347 | 5/1989 | Rabe | 307/451 X |
| 4,843,254 | 6/1989 | Motegi et al. | 307/272.2 |

FOREIGN PATENT DOCUMENTS 60-18018 1/1985 Japan .

OTHER PUBLICATIONS

"Cascode Voltage Switch Logic: A Differential CMOS Logic Family", L. Heller, W. Griffin, 1984 *IEEE International Solid–State Circuits Conference*, pp. 16–17.
"Differential Split–Level CMOS Logic for Subnanosecond Speeds", L. Pfennigs, W. Mol, J. Bastiaens, J. van Dijk, *IEEE Journal of Solid–State Circuits*, vol. SC-20, No. 5, 10/85, pp. 1050–1055.

*Primary Examiner*—David Hudspeth
*Attorney, Agent, or Firm*—W. T. Udseth

[57]           ABSTRACT

A data storage latch which permits forming a feedback loop for storage and permits storing data signals in an open loop configuration using logic circuit elements based on cross-coupled transistor loads.

21 Claims, 1 Drawing Sheet

SWITCHING STATE RETENTION CIRCUIT

RELATED APPLICATION

Reference is hereby made to earlier filed copending application by R. Rabe entitled "Charge Disturbance Resistant Logic Circuits Utilizing True and Complement Input Control Circuits" having Ser. No. 07/144,664 now U.S. Pat. No. 4,833,347. This copending application has been assigned to the same assignee as the present application.

BACKGROUND OF THE INVENTION

The present invention relates to switching state retention circuits of the kind permitting a switching state at the input thereof to appear at the output thereof only after an enabling signal has permitted such a result and, more particularly, such switching state retention circuits which are formed by use of a feedback loop path arrangement.

There are many uses in digital systems for D-type flip-flops, i.e. data latches. Such latches are used frequently to store a signal value representing data received at a data input for a duration of time after an enabling signal of a particular logic value has also been received at an enable input, This arrangement is useful, for instance, in permitting subsequent portions of the digital system to operate on a fixed value signal at the output of the latch even though further changes are occurring at the latch data input.

Such D-type flip-flops or data latches are commonly provided in monolithic integrated circuits, along with much other circuitry, for purposes of improving performance, reducing size and reducing cost. Monolithic integrated circuit structural features arising in the implementation of such circuits have been shrinking rapidly in size in recent years. Along with this shrinkage, the electrical currents and electrical charges formed and manipulated in integrated circuits based on these features have also been diminishing in value. As a result, charges generated by certain charge generating disturbances, which in larger feature integrated circuits would not be a problem, become sufficiently large to cause difficulties in smaller feature integrated circuits.

In voltage level state switching circuits, such as logic circuits or memory circuits including such data latch circuits, which are constructed using such smaller integrated circuit structures, such disturbance charges can be sufficient to cause switching from an existing logic state to another at points in the circuit where such charge is generated. The proper operation of the circuit could therefore be disturbed resulting in erroneous logic signals. Typically, such disturbances are local to the region near the disturbance and are temporary; thus such a disturbance is often termed a "single event upset." Also, though the disturbance cause may be temporary, the results of the disturbance may be stored and are subject to being propagated further in the system which may lead to longer term and more significant defects.

In a D-type flip-flop, or data latch, using a feedback path arrangement, a charge disturbance transient event can propagate around the feedback path arrangement back to the location of the disturbance. As a result, the feedback path arrangement can reinforce this disturbance to result in establishing a logic state change in the feedback loop.

A common source of such charge generating disturbances is particle radiation. Such particles impinging on a monolithic integrated circuit chip will have "interactions" with the semiconductor material lattice structure and electrons along the paths thereof through the integrated circuit semiconductor material. This will result, for the short duration of these interactions, in raising the energy of the electrons involved into the conduction band and leaving corresponding holes in the valence band. Should such electron-hole pairs be generated sufficiently close to a semiconductor pn junction, the electrons and holes so situated are subject to being collected by the action of electric fields in the region resulting from the voltage applied to such junction and because of diffusion toward such junction. The structure of transistor devices in monolithic integrated circuits, and the methods of operating both such devices and the circuits using them generally, is such that only reverse-biased pn junctions need to be considered to understand the effects of a radiation particle impinging thereabout The electrons and corresponding holes will be separated by the electric fields near the reverse-biased junction with the electrons attracted to the positive voltage side of the junction and the holes being attracted, or repelled, into the portions of the semiconductor material on the other side of the junction. This separation of electrons and holes, in effect, provides a temporary current flow from the positive voltage side of the semiconductor pn junction to the opposite side of this junction or, in effect, a radiation induced leakage current.

This current will be comprised of an immediate drift current component for electrons and holes which are immediately subject to such electric fields. A further component of this current will be provided by those electrons and holes which subsequently, by diffusion, move to be within the influence of such electric fields. Such current flows have the effect of discharging an n-type conductivity region placed at a positive voltage with respect to a p-type conductivity region on the other side of the intervening junction so that junction is reversed-biased. Such a discharge current reduces this positive voltage. Conversely, such currents tend to charge a p-type conductivity region placed at a negative voltage with respect to an n-type conductivity region on the other side of an intervening semiconductor pn junction to reverse-bias that junction. Such a charging acts to reduce the negative voltage to thereby reduce the reverse-bias across said junction. Thus, in either situation, the charge generated by an impinging radiation particle would act in a manner to tend to reduce the magnitude of reverse-bias voltages provided across reverse-biased semiconductor pn junctions separating p-type conductivity and n-conductivity regions suffering such an impingement.

The effects of radiation particle impingement on regions of semiconductor material near a reverse-biased semiconductor pn junction are a bit less severe for complementary metal-oxide-semiconductor (CMOS) technology because either the n-channel metal-oxide-semiconductor field-effect transistor (MOSFET) or the p-channel MOSFET in each pair will be formed in a "well" or "tub" in the semiconductor material substrate, while the remaining member of the pair will be formed directly in the substrate. The devices provided directly in the substrate will have all of the risks for reverse-bias semiconductor junctions therein due to radiation particle impingement thereabout as were described above. However, the other devices formed in "wells" in the semiconductor material substrate will have some of the charge induced therein attracted by the fields at the semiconductor pn junction separating the well from the substrate and, therefore, this charge will not all be affected by the electrical fields near the semiconductor pn junction separating the device drain region from the well.

Even so, radiation particle impingement on a reverse-bias drain region of either an n-channel or p-channel MOSFET, with the resulting reduction in the associated reverse-bias voltage, poses a risk of a logic state change at circuit nodes to which same is connected. If the circuit involved is a D-type flip-flop with a feedback loop arrangement, such a voltage reduction can be propagated around the feedback arrangement before the reverse-bias voltage across the affected drain-substrate junction involved has sufficiently recovered its former voltage value. As a result, a new logic state could be established and maintained in the feedback loop arrangement.

Such a result can be substantially prevented by use of the feedback logic gate circuit arrangement disclosed in the copending application indicated above which is hereby incorporated herein. As described there, the cross-coupled transistor load logic gate circuitry subject to certain conditions can prevent the establishment of such a logic change due to a radiation particle impingement along the feedback path of such a feedback logic gate arrangement serving as a data latch. However, the effects of radiation particle impingement on circuitry external to such a feedback logic gate arrangement is not protected against unless this external circuitry is fully implemented using also only cross-coupled transistor load logic gate circuits. Thus, the data input signal circuitry with a clock signal input circuitry to the latch, suffering a radiation particle impingement therein, may lead to the introduction of incorrect logic states into the feedback loop.

Thus, a data latch which is resistant to establishing erroneous logic states therein due to errors in the data signals or clock signals supplied thereto would be desirable as this would allow supplying such signals from circuitry implemented using logic gate circuits other than cross-coupled transistor load logic gate circuits. Further, such a data latch should protect against transient logic state changes occurring therein being established as erroneous logic states in the latch.

SUMMARY OF THE INVENTION

The present invention provides a data storage latch having a loop joining and access logic arrangement, which permits forming a feedback loop with further latch components and permits accepting data signals in an open loop configuration. This means is electrically connected at its output arrangement to the input arrangement of both an inverter means and a logic gate, the inverter means output arrangement also connected to the logic gate input arrangement. The logic gate output arrangement is connected to a feedback input arrangement in the loop joining and access arrangement to permit this latter arrangement to close the feedback loop. The logic gate is permitted to change logic states if proper signals are present at the output arrangements of both the logic joining and access arrangement and the inverter.

The loop joining and access arrangement, the inverter means and the logic gate are each formed with cross-coupled transistors as loads from each of which an output is obtained to provide a pair of outputs therefor, with there being corresponding pairs of inputs for each of these means including multiple pairs of inputs for the loop joining and access arrangement and the logic gate. The data latch can be constructed using a p-channel MOSFET for each cross-coupled transistor, and using an n-channel MOSFET for each remaining transistor although other transistor types can also be used.

DETAILED DESCRIPTION OF THE PREFERRED EMBODIMENTS

Figure 1:
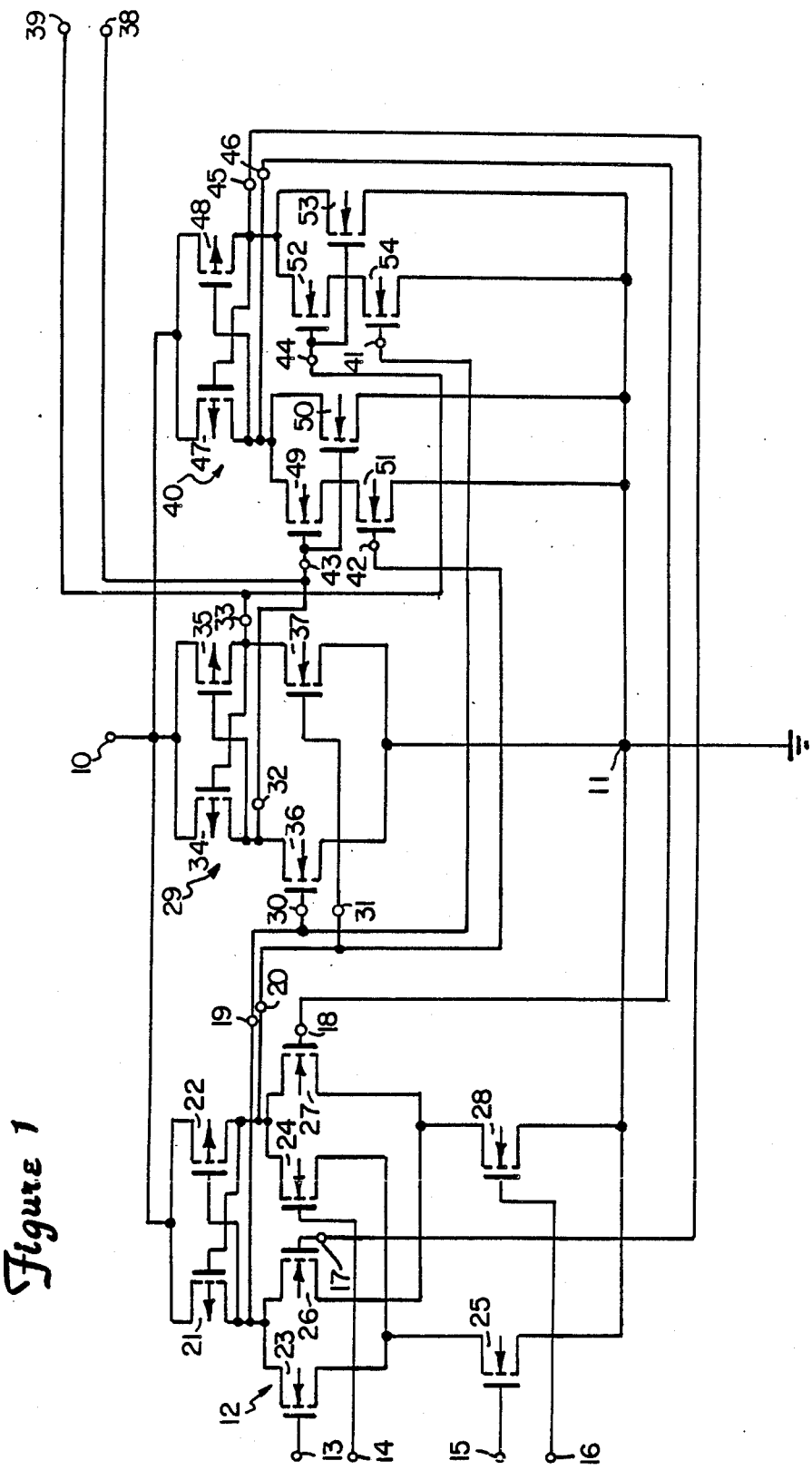
FIG. 1 shows a schematic circuit diagram embodying the present invention.

The logic gate circuit arrangement to be described below can be implemented in various circuit technologies and in various monolithic integrated circuit technologies as indicated in the earlier incorporated application. However, the primary description following will be based on CMOS field-effect transistor circuits formed in a monolithic integrated circuit using an n-well structural arrangement in a p-type conductivity substrate. Each enhancement mode, n-channel insulated gate field-effect transistor (IGFET), e.g. a silicon gate MOSFET, is formed as a switching device directly in the substrate. Each enhancement mode, p-channel IGFET, e.g. a silicon gate MOSFET, is formed as a switching device in an n-type conductivity region, the well or tub, which is earlier formed in the p-type conductivity substrate. In such an arrangement, each substrate connection for each n-channel MOSFET is made to the p-type conductivity substrate and this substrate is typically connected to the most negative supply voltage in the circuit, usually ground. Each of the p-channel MOSFET connections is made to the n-type conductivity well or tub in which it is formed, these wells in turn being, typically, each electrically connected to the most positive supply of voltage in the circuit. Such substrate connections are not shown in FIG. 1 to minimize schematic diagram complexity.

The n-channel MOSFET's in the circuit typically have a common channel length so that they perform similarly to one another over fabrication process and operating temperature variations, and so typically do the p-channel MOSFET's. After fabrication, these n-channel and p-channel MOSFET's will all have approximately the same effective channel length even though they are designed with different channel lengths initially, the difference compensating for somewhat different results in the fabrication process for the two kinds of transistors. Thus, differences in the desired "on" condition resistance for these transistors, determined by channel length-to-width ratios, will be provided through selecting different channel widths for different transistors. Alternatively, a series combination of the same kinds of transistors can be provided to achieve, in effect, a longer channel length.

Also, steps taken in the fabrication process to set the value of the threshold voltage for both the n-channel and p-channel MOSFET's results in both kinds of transistors having a zero source-substrate voltage difference threshold voltage of approximately the same magnitude, but of the opposite sign as the nature of these two kinds of transistors requires. The zero source-substrate voltage difference threshold voltage value for the n-channel MOSFET's in the description here is approximately 0.8 volts, and for the p-channel transistors it is approximately −0.8 volts. Variations of the threshold voltage due to fabrication process variations lead to similar change in value and in a common direction for both n-channel and p-channel MOSFET's. However, changes in threshold voltage due to temperature affect the magnitude only of the threshold voltage of each kind of transistor.

FIG. 1 is a schematic diagram of the data latch circuit of the present invention. The circuit is connected between a first voltage terminal means, 10, adapted for connection to a source of positive voltage of typically 5.0 volts, and a ground reference terminal, 11. The first portion of the circuit to the left is a multiple input logic gate, 12, which provides access to the storage capability of the circuit for incoming logic signals, and accepts feedback signals from another circuit portion, depending on the status of timing or enabling signals also provided thereto. Incoming data signals from external circuitry are applied to a first data input terminal, 13, and the complements of these signals are provided at a further data input terminal, 14. The timing or enabling signals, also from external circuitry, are applied to a further input terminal, 15, and again the complements of these timing or enabling signals are provided to a further terminal, 16. Logic gate 12 also has a further pair of input terminals for feedback signals, 17 and 18. Finally, logic gate 12 has a pair of output terminals, 19 and 20.

A pair of cross-coupled p-channel MOSFET's, 21 and 22, are provided as the load devices for logic gate 12. The sources of transistors 21 and 22 are each electrically connected to positive voltage terminal 10. The drain of transistor 21 is connected to output terminal 19 as is the gate of transistor 22. The drain of transistor 22 is connected to output terminal 20 as is the gate of transistor 21.

Data signal input terminal 13 is connected to the gate of an n-channel MOSFET, 23, having its drain connected to logic gate output 19. Complementary data signal input terminal 14 is connected to the gate of another n-channel MOSFET, 24, having its drain connected to logic gate output 20. The sources of transistors 23 and 24 are electrically connected together and to the drain of a further n-channel MOSFET, 25. Timing or enabling terminal 15 is connected to the gate of transistor 25, and the source of transistor 25 is connected to ground reference terminal 11.

Feedback input terminal 17 is connected to the gate of another n-channel MOSFET, 26, having its drain connected to output 19 of logic gate 12. Complementary feedback input terminal 18 is connected to the gate of yet another n-channel MOSFET, 27, having its drain electrically connected to output 20 of logic gate 12. The sources of transistor 26 and 27 are connected together and to the drain of a final n-channel MOSFET, 28, in logic gate 12. Complementary timing or enabling input terminal 16 is connected to the gate of transistor 28, and the source of transistor 28 is connected to ground reference terminal 11.

Outputs 19 and 20 of logic gate 12 are connected to two further circuit portions. The first of these is an inverter, 29, having a pair of input terminals, 30 and 31. Inverter 29 also has a pair of output terminals, 32 and 33. In addition to providing an output logic state on one of these outputs that is the complement of the logic state on one of the inputs, inverter 29 provides at the other output the same logic state as that occurring on that input. Thus, though this circuit portion 29 will continue to be referred to as an inverter, it can be viewed as providing a slightly broader capability than does an ordinary inverter logic gate.

Again, the load arrangement used in inverter 29 is a pair of cross-coupled transistors. The first of these is a p-channel MOSFET, 34, and the other is also a p-channel MOSFET, 35. The sources of transistors 34 and 35 are connected together and to positive voltage terminal 10. The drain of transistor 34 is connected to inverter output 32 as is the gate of transistor 35. The drain of transistor 35 is connected to inverter output 33 as is the gate of transistor 34.

Inverter input 30 is connected to the gate of an n-channel transistor, 36, having its drain electrically connected to inverter output 32. Complementary inverter input terminal 31 is connected to the gate of a further n-channel MOSFET, 37, having its drain connected to inverter output 33. The sources of transistors 36 and 37 are connected together and to ground reference terminal 11. Output 19 of logic gate 12 is electrically connected to inverter input 30, and output 20 thereof is electrically connected to inverter input 31. Inverter output 32 is connected to an output, 38, for the data latch, and inverter output 33 is connected to a complementary output, 39, for the data latch.

The outputs of logic gate 12 are connected to inputs of a further logic gate, 40, which in turn provides feedback signals to logic gate 12. Output 19 of logic gate 12 is connected to an input terminal, 41, of logic gate 40. Output 20 of logic gate 12 is connected to a complementary input terminal, 42, of logic gate 40.

Inverter 29 also has its outputs connected to inputs of logic gate 40. Inverter output 32 is connected to an input terminal, 43, of logic gate 40. Inverter output terminal 33 is connected to another input terminal, 44, of logic gate 40. Logic gate 40 has a pair of outputs also, 45 and 46. Output 45 of logic gate 40 is connected to feedback input 17 of logic gate 12. Output 46 of logic gate 40 is connected to feedback input 18 of logic gate 12.

Logic gate 40 also has a pair of cross-coupled transistors as loads therein. A p-channel MOSFET, 47, has its source connected to that of another p-channel MOSFET, 48, and each of these sources is connected to positive voltage terminal 10. The drain of transistor 47 is connected to output 46 of logic gate 40 as is the gate of transistor 48. The drain of transistor 48 is connected to logic gate output 45 as is the gate of transistor 47.

Input terminal 43 is connected to each of the gates of two n-channel MOSFET's, 49 and 50, each of which has its drain connected to output 46 of logic gate 40. Input terminal 42 is connected to another n-channel MOSFET, 51, the drain of which is connected to the source of transistor 49. The sources of transistors 50 and 51 are each connected to ground reference terminal 11.

Input terminal 44 is connected to the gates of two further n-channel MOSFET's, 52 and 53, each of which has its drain connected to output 45 of logic gate 40. Input 41 of logic gate 40 is connected to a final n-channel MOSFET, 54, of logic gate 40, transistor 54 having its drain connected to the source of transistor 52. The source of each of transistors 53 and 54 are again connected to ground reference terminal 11.

In operation, a logic state representing input information can be introduced into the latch for storage if an enabling signal on terminal 15 is in a high voltage level logic state and a signal that is the complement thereof, i.e. simultaneously having a low voltage level logic state, is applied to terminal 16. A high voltage level logic state will typically have a voltage value of within a tenth or two-tenths volts of the voltage appearing on terminal 10, and a low voltage level logic state will typically have a voltage value which again is approximately the voltage appearing on terminal 11. For positive logic, the high voltage level logic state would represent a Boolean constant having the value "1", and the low voltage level logic state will represent a Boolean constant having the value "0".

In any event, the high voltage on terminal 15 will switch transistor 25 into the "on" condition to thereby connect the sources of transistors 23 and 24 to terminal 11 giving them control of the logic states which will appear at outputs 19 and 20 of logic gate 12. Thus, input data signals in complementary logic states applied to terminals 13 and 14 will result in a corresponding pair of complementary logic states at terminals 19 and 20. The low voltage level logic state applied to terminal 16 of transistor 25 will leave that transistor in the "off" condition so that no circuit pathways can be established through either of transistors 26 or 27 leaving these latter two transistors unable to affect the logic states, represented by voltage levels, occurring at outputs 19 and 20.

As an example, assume that output 19 is initially in a high voltage level logic state and output 20 is in a correspondingly low voltage level logic state because input 13 is at a low voltage level logic state and input 14 is at a high state. In a stable circuit value situation, corresponding output 32 of inverter 29 will be in the low voltage level logic state because transistor 36 is switched "on" by the high state at output 19, and output 33 thereof will be in a high voltage level logic state because transistor 37 is switched "off." Also, correspondingly, output 45 of logic gate 40 will be in a low voltage level logic state as transistors 52 and 54 are switched "on" by high logic states on outputs 33 and 19, respectively, (transistor 53 is also "on") and output 46 thereof will be in a high voltage level logic state with transistors 49 and 51 "off" (transistor 50 is also "off"). These various output logic states are consistent with the results expected for normal circuit operation. (Transistors 50 and 53 are used to protect against erroneous circuit operation due to charge disturbances, as will be described below, but do not offset ordinary circuit operation. They can be relatively high impedance devices and so can have relatively small width-to-length ratios.)

Assume that the succeeding logic states from the preceding circuitry provided on terminals 13 and 14 are such that terminal 13 is brought to a high voltage level logic state and terminal 14 is brought to a complementary low voltage level logic state. Transistor 23 will switch into the "on" condition as a result, and transistor 24 will be in the "off" condition with its gate at a low voltage level logic state. Therefore, the gate of p-channel transistor 22 will be brought to near the voltage occurring on terminal 11 switching transistor 22 into the "on" condition. Transistor 21 will switch to the "off" condition since its gate will be at a voltage value near that appearing on terminal 10 with transistor 22 now being "on". This will result in output 19 of logic gate 12 being in the low voltage level logic state and output 20 being in the high voltage level logic state, just the reverse of the initial condition described in the preceding paragraph.

Since outputs 19 and 20 of logic gate 12 are the sources of input signals to inputs of both inverter 29 and logic gate 40, the high voltage state occurring on output 20 of logic gate 12 will begin to affect both of these other circuits. That is, input 31 of inverter 29 also moves to the high voltage level logic state with output 20 switching transistor 37 "on." Simultaneously, the voltage state at input 42 of logic gate 40 moves to the high voltage level logic state with output 20 switching transistor 51 "on." Output 19 of logic gate 12, being in the low voltage level logic state, establishes that state at input 30 of inverter 29, leaving transistor 36 in the "off" condition, and at input 41 of logic gate 40 leaving transistor 54 in the "off" condition.

This switching of transistor 37 into the "on" condition brings the gate of p-channel transistor 34 near the voltage on terminal 11, switching transistor 34 into the "on" condition. Transistor 35 will switch to the "off" condition since its gate is near the voltage value on terminal 10 with transistor 34 now being "on". This will result, after the usual switching delays because of the time needed to charge the various capacitances, in output 32 of inverter 29 moving to a high voltage level logic state and output 33 thereof moving to a low voltage level logic state.

Here, a switching time is required for the change of input logic states at inputs 30 and 31 of inverter 29 to result in a change in the logic states at the outputs thereof. During that time, the presence of a high voltage value logic state at input 42 of logic gate 40, switching transistor 51 into the "on" condition, will be ineffective in causing any changes in the logic values at outputs 45 and 46 of logic gate 40. Because, until the completion of the switching of the logic states at outputs 32 and 33 of inverter 29 to new logic state values, the voltage value at input 44 of logic gate 40 remains at the low voltage level logic state initially occurring on output 32 of inverter 29. Once the change in output logic values of inverter 29 occurs in response to changes at inputs 30 and 31, i.e. the switching time for inverter 29 from input to output has elapsed, the logic states at outputs 32 and 33 resulting will be effectively applied to the inputs of logic gate 40 including input 44 to switch transistor 49 into the "on" condition.

At this point, logic gate 40 can then begin to respond to the logic value changes initiated at outputs 19 and 20 of logic gate 12. The gate of p-channel transistor 48 will be brought to near the voltage level on terminal 11 through "on" transistors 49 and 51 thereby switching transistor 48 into the "on" condition. The low voltage level logic state at output 33 of inverter 29 will keep transistors 52 and 53 in the "off" condition in logic gate 40. This will leave the gate of transistor 47 at a voltage near that appearing on terminal 10 so that it is in the "off" condition. As a result, output 45 of logic gate 40 will be in a high voltage level logic state, and output 46 will be in a low voltage level logic state. These logic states on outputs 45 and 46 are applied to inputs 17 and 18, respectively, of logic gate 12 but they are ineffective to cause any changes therein because of transistor 28 having been placed in the "off" condition by the low voltage level logic state enabling signal applied to terminal 16.

If, in these circumstances, the enabling signals on terminals 15 and 16 are caused to switch to the opposite logic state, there will be a low voltage level logic state on terminal 15 to switch transistor 25 into the "off" condition, and a high voltage level logic state on terminal 16 switching transistor 28 into the "on" condition. As a result, the high voltage level logic state on output 45 of logic gate 40, applied to input 17 of logic gate 12, will be effective in switching transistor 26 into the "on" condition to continue the connection of the gate of transistor 22 to the voltage appearing on terminal 11. Similarly, the low voltage state logic level on terminal 46 will be applied to input 18 of logic gate 12 to switch transistor 27 into the "off" condition. Thus, removal or switching of logic signals at the information inputs 13 and 14 will have no effect on the logic states at the outputs of logic gate 12, and the outputs of logic gate 40, being at logic states consistent with those that had been applied before the change in enabling signals on terminals 15 and 16, will keep logic gate 12 with the same logic states at its outputs that it had so that the logic state situations at the outputs of logic gate 12, inverter 29, and logic gate 40 will all remain unchanged.

Unfortunately, this correct operational sequence is subject to being altered by charge disturbance events occurring in the monolithic integrated circuit in which the circuit of FIG. 1 is fabricated if these events occur sufficiently close to the circuit components therein. In particular, a charge disturbance near a reverse-biased junction of any of the transistors in this circuit because of an impinging radiation particle can lead to a temporary change in the logic state at the circuit node to which this junction is connected in the manner described above. As indicated there, in the absence of steps anticipating such events, these temporary circuit node erroneous logic state switchings can lead to error propagation in a circuit. The circuit of FIG. 1, however, provides for correct operation even in the face of these possibilities for erroneous operation.

A first kind of problem which can arise is the upset of a circuit node causing a logic state change thereon in the external input circuitry supplying information in the form of varying logic states in signals to system inputs 13 and 14 of logic gate 12. That is, enabling signals applied to terminals 15 and 16, such as to have terminal 15 in a high voltage level logic state and a complement logic state at 16, permits changes occurring at inputs 13 and 14 to be further introduced into the remainder of the circuit of FIG. 1. If these enabling signals are in the process of being switched to opposite logic states so that the logic states resulting at the various outputs in the circuit of FIG. 1 from the current set of logic states applied at terminals 13 and 14 are to be maintained, there is a risk that an erroneous state occurring in the input circuitry connected to terminals 13 and 14 due to a charge disturbance therein could be maintained in error in the circuit of FIG. 1.

An error in the reverse situation is a further risk. Assume the enabling signals on terminals 15 and 16 are such that a low voltage level logic state appears on terminal 15, and the opposite state on terminal 16, so that a set of logic states is being maintained at the various outputs in the circuit of FIG. 1 even though the input logic circuitry to logic gate 12 is providing changing logic states at input terminals 13 and 14. An error due to a charge disturbance in the external circuitry providing such enabling signals can cause a reversal of states at terminals 15 and 16 so that there is a risk that one of the unwanted states occurring on terminals 13 and 14 is further introduced during this period of erroneous signals on terminals 15 and 16 which, when corrected, leads to maintaining thereafter the wrong set of logic states at the various outputs of the logic gates and inverter in the circuit of FIG. 1.

The circuit of FIG. 1 avoids these unwanted results by the arrangement therein having both the inverter and logic gate 40 operated by the logic states occurring on the outputs of logic gate 12, but with logic gate 40 being operated jointly also by the logic states occurring at the outputs of inverter 29. Since the effect of this arrangement is to prevent logic states on logic gate 40 from changing until the switching time of inverter 29 has elapsed, the erroneous results just described can be avoided to a great extent by choosing the switching time of inverter 29 to be substantially longer than the times during which such disturbance errors can persist in the external input circuitry connected to terminals 13 or 14, or in the external enabling circuitry connected to terminals 15 and 16. If this is done, the charge disturbance logic state errors in such circuits will be dissipated as the nodes are recharged or discharged after the occurrence of the effects of radiation particle impingement at a reverse-biased junction connected thereto before any switching of logic states at the output of logic gate 40 are permitted to occur. During the switching time of inverter 29, the previous and correct logic state is maintained on the outputs of gate 40 by the parasitic capacitances associated with the gate 40 outputs 45 and 46, and with gate 12 inputs 17 and 18.

This long switching time for inverter 29 compared to the duration of charge disturbance logic errors is easily accomplished since, as indicated above, the duration of an erroneous logic state at a node connected to a reverse-biased pn junction because of, for instance, a radiation particle impingement thereat will be very short. The switching time of inverter 29 can be made adequately long compared to such a time by any of or a combination of several methods. The most straightforward would be to decrease the width-to-length ratios of transistors 34 and 35 or add unused devices to the outputs 32 and 33 of inverter 29 to increase the capacitance of the circuit nodes therein to slow the switching thereof. Alternatively, the transistor width-to-length ratios in the input circuitry connected to nodes 13 and 14, or in the enabling circuitry connected to nodes 15 and 16, can be increased to reduce the time it takes to charge or discharge a reverse-biased region which has been subjected to a radiation particle impingement to thereby restore the proper voltage value thereat.

Another possibility leading to erroneous results can occur when a set of logic state values at the various outputs of logic gates 12 and 40, and inverter 29, in the circuit of FIG. 1 have been chosen to be maintained because of applying a low voltage level logic state to terminal 15 and a high voltage level logic state to terminal 16 of logic gate 12. If a circuit node within the feedback loop established by this arrangement should be forced to switch voltage levels thereon because of a radiation particle impingement at a reverse-biased junction connected thereto, there is a risk of such a logic state change being propagated along the feedback loop back upon itself to result in maintaining a stably new, but erroneous, logic state because of the radiation particle impact. However, the choice of the circuitry type used to implement logic gates 12 and 40, and inverter 29, in the circuit of FIG. 1 can prevent such erroneous logic states from being maintained in that feedback loop.

As indicated above, any circuit node at a high voltage level logic state can be temporarily forced to a low voltage level logic state by a radiation particle impact at that junction connected thereto that is reverse-biased and, similarly, any circuit node at a low voltage value logic state can be forced temporarily to a high voltage value logic state for the same reason. Each output of logic gates 12 and 40, and inverter 29, has either an "on" condition p-channel MOSFET connected thereto and an "off" condition n-channel MOSFET, or vice versa, so that there will always be one reverse-biased junction connected thereto which is in whichever of the transistors is in the "off" condition. Thus, any circuit node in the feedback loop is subject to being temporarily forced into an erroneous logic state by a radiation particle impingement on the reverse-biased junction connected thereto.

An n-channel device in the "off" condition will have its drain connected to a circuit node exhibiting a high voltage level logic state and a radiation particle impingement can only cause the reverse-biased drain-substrate junction to discharge and so temporarily change the circuit node logic state to a low voltage value logic state. Conversely, a circuit node having a p-channel device in the "off" condition connected thereto will exhibit a low voltage value logic state, and a radiation particle impingement thereat can only cause this node to charge and change to a high voltage value logic state temporarily.

In the circuit of FIG. 1, inputs to each of the logic gates 12 and 40, and inverter 29, are connected to one or more n-channel MOSFET's. In any situation where the circuit node connected to such an n-channel MOSFET input gate is switched erroneously from a high voltage level logic state to a low voltage level logic state, the n-channel device will switch to the "off" condition temporarily during the short duration of charge generation by the impinging radiation particle until the reverse-biased drain region collecting the electrons generated is charged by the circuit so that the circuit node connected thereto recovers its former high voltage level state. The conductive path that had been established by an input n-channel MOSFET having its gate connected to such a circuit node in any of logic gates 12 and 40, or inverter 29, because of the high voltage level logic state applied to its gate, is thus interrupted so that the low impedance connection between the output thereof connected to the drain of the affected n-channel MOSFET and ground is eliminated for a short period of time.

However, the initial p-channel MOSFET connected at its drain to this output in any of logic gates 12 or 40 or inverter 29 is always in the "off" condition, because the other output in the logic gate or inverter is in the high voltage level logic state, and so cannot cause this p-channel MOSFET to supply any current to change the charging situation at the first output. Thus, the parasitic capacitances connected to that output will retain the same charge they had during that disturbance, and so this output will remain at the same voltage it had before the disturbance.

The gate of the other, or opposite, p-channel MOSFET in any of logic gates 12 or 40 or inverter 29, also connected to the drains of the initial p-channel MOSFET and the temporarily "off" n-channel MOSFET, will thus temporarily not be connected to ground but stays at the same voltage. Hence, this opposite p-channel MOSFET will continue to be in the "on" condition. Since the n-channel transistor connected to that node will still be in the "off" condition, the voltage situation at that output node will also not change. Hence, two low voltage level logic states on the inputs will not change the output logic states of any of logic gates 12 and 40 or inverter 29 if the error does not last past the discharge times of parasitic capacitances found at these outputs.

Thus, an erroneous pair of low voltage level logic states from a previous circuit stage at the inputs of either logic gates 12 or 40 or inverter 29 of FIG. 1, whether the error is in the external circuitry or in the preceding one of these logic gates or inverter connected thereto, need not propagate past that logic gate or inverter in FIG. 1 at the inputs of which the erroneous two low voltage level logic states are presented. Charge disturbances in monolithic integrated circuits are usually quite short and, in the case of an impinging radiation particle, the duration of the charge accumulation event is many orders of magnitude shorter than the time constants inherent in MOSFET integrated circuit technologies, including those involved in discharging parasitic capacitances. As a result, logic gates 12 and 40 and inverter 29 will indeed not propagate an error occurring in an input signal provided thereto which causes such input signal to change erroneously from a high voltage level logic state to a low voltage level logic state.

However, there is considerable importance in assuring that when a change disturbance leads to a logic state change at a circuit node in any of logic gates 12 or 40, or inverter 29, that the result at the outputs thereof be an error which appears as two identical logic states rather than the error appearing as the complementing of the two correct logic states. This latter situation, where the erroneous states are presented as complements of the correct states to the inputs of either of logic gates 12 or 40, or inverter 29, would appear to them as a correct form logic signals and would be propagated. Hence, the necessity is to have errors occurring in any of logic gates 12 or 40, or inverter 29, presented to the subsequent one of these connected thereto as a pair of same value logic states as a result of the occurrence of an error due to a charge disturbance.

Consider first, using inverter 29 as an example, that the logic signals presented at the outputs 19 and 20 of logic gate 12 are such that a high voltage level logic state occurs on input 30 to inverter 29 and a low voltage level logic state occurs on input 31 thereof. In this situation, transistors 36 and 35 will be in the "on" condition, and transistors 37 and 34 will be in the "off" condition. As a result, output 33 of inverter 29 is at a high voltage level logic state and output 32 is at a low voltage level logic state.

A radiation particle of sufficient energy impinging on the drain of n-channel MOSFET 37 in the "off" condition will result in that drain being temporarily brought to approximately the voltage on terminal 11 through the accumulation of electrons therein even though transistor 35 is in the "on" condition. This results in the gate of p-channel MOSFET 34 also being brought to nearly the voltage on terminal 11 and, therefore, transistor 34 will switch from the "off" to the "on" condition. Transistor 34 will then pass current supplied through terminating region 10 to transistor 36, already in the "on" condition, and will attempt to charge the parasitic capacitance associated with output 32. Both of these actions resulting from switching transistor 34 into the "on" condition will tend to raise the voltage on output 32 toward the high voltage level logic state.

Should output 32 rise in voltage toward the high voltage level logic state sufficiently to exceed the switching threshold of logic gate 40 at input 43 thereof, both input 43 and input 44 would receive signals reflecting the after-disturbance output voltage states occurring at outputs 32 and 33 which are just the opposite of the output voltage logic states being commanded by signals at inputs 30 and 31 of inverter 29. Since these after-disturbance signals at outputs 32 and 33 are in opposite logic states, i.e. complementing one another, they would appear to logic gate 40 at the inputs thereof to be valid signals to be propagated, thus propagating an error (ignoring the effects in this example involving just inverter 29 of transistors 51 and 54).

Such erroneous output signals which are the complement of the correct output signals must be prevented. This can be done by preventing a sufficient voltage rise at output 32 to exceed the threshold value at input 43 of logic gate 40 which must be exceeded to affect the logic states at its outputs. Achieving such prevention requires having transistor 36 being capable of passing all of the current which can be supplied by transistor 34 as a result of its being erroneously switched into the "on" condition without an accompanying voltage rise thereacross exceeding this threshold of input 43. Such a result can be accomplished by constructing transistor 36 with a width-to-length ratio which is sufficiently in excess of that ratio provided for transistor 34.

As a general matter, then, the various circuit paths which can be established from either output of any of logic gates 12 and 40, and inverter 29, must be designed so that the impedance therealong is sufficiently small so that current supplied through the p-channel MOSFET drain connected thereto can be shunted to terminal 11 without a voltage rise at the output which would exceed the switching point threshold of the circuit connected to that output. Such switching thresholds will typically be at least the threshold value of the n-channel MOSFET connected to the input of interest. If this design condition is followed, then the erroneous logic states appearing at the outputs of any of logic gates 12 or 40, and inverter 29, for a radiation particle impact on an n-channel MOSFET drain in the "off" condition therein will always be a pair of low voltage level logic states. As has been previously shown, such a condition presented at the inputs of any of logic gates 12 or 40, or inverter 29, will not propagate past that logic gate.

Another possibility which can occur, as indicated above, is the change of logic state at a circuit node from a low voltage level logic state to a high voltage level logic state. Assume again that there is a high voltage level logic state signal on input 30 and a complementary low voltage level logic state on input 31 of inverter 29 used as an example. Again, transistors 36 and 35 are in the "on" condition while transistors 37 and 34 are in the "off" condition. This leaves output 33 in a high voltage level logic state and output 32 in a low voltage level logic state. If, however, the radiation particle impingement is on the reverse-biased drain region of p-channel MOSFET 34 in the "off" condition rather than the drain of n-channel MOSFET 37 in the "off" condition, as it was previously in the example above, the drain of p-channel MOSFET 34 will charge positively through accumulation of holes therein, charging also the parasitic capacitances associated with output 32. As a result, output 32 will move temporarily from a low voltage state logic level to a high voltage state logic level even though transistor 36 is in the "on" condition. This results in the gate of transistor 35 being raised to this high voltage value so that it is switched from the "on" condition to the "off" condition. However, with transistor 37 also in the "off" condition because of the input signal on input 31, output 33 will not have the parasitic capacitance associated therewith either charged or discharged and so will remain in its high voltage state it had prior to the disturbance. Thus, both outputs 32 and 33 of inverter 29 are in the high voltage state which is a result contrary to what the input signals on inputs 30 and 31 of inverter 29 are directing the inverter to provide as output signals.

Since output 33 was already in the high voltage level logic state, no change will occur in the logic state on input 44 of logic gate 40 because of any change in the logic state occurring on this output. Therefore, the most that this pair of high voltage value logic states could do in gate 40 would be to have an n-channel MOSFET therein, formerly in the "off" condition, be switched into the "on" condition, here having the erroneous high voltage value logic state occurring at output 32 switch transistor 49 into the "on" condition.

If transistors 51 and 54 were replaced by short circuits from drain to source, one can see that the most that these high voltage value logic states on outputs 32 and 33 of inverter 29 could do would be to have switched "on" both transistors 49 (and 50) and 52 (and 53), a result which would lead to having outputs 45 and 46 of logic gate 40 both in a low voltage level logic state. As indicated above, such a condition would not be propagated past the logic gate to which outputs 45 and 46 were connected.

However, since transistors 51 and 54 are present, a temporary disturbance occurring in inverter 29 leading to its outputs each being in a high voltage value logic state will not propagate beyond inverter 29. This is because logic gate 12 controls transistors 51 and 54 and such an occurrence in inverter 29 will have no effect in logic gate 40 because there will be no similar switching result in logic gate 12 to correspondingly affect transistors 51 and 54. (Transistors 50 and 53 have, as indicated above, small width-to-length ratios and so cannot propagate the incorrect logic state present on the inputs of each during the charge disturbance transient because the relatively high impedance of each cannot, even if in the "on" condition, sink the current supplied by transistors 47 and 48.)

Similarly, a charge disturbance in logic gate 12 causing each of outputs 19 and 20 to be in the high voltage value logic state will not propagate past logic gate 40. The two high voltage value logic states on outputs 19 and 20 of logic gate 12 will cause two low voltage value logic states on outputs 32 and 33 of inverter 29 in the same manner as described above for the example of inverter 29 having two high voltage value logic states in its outputs affecting logic gate 40. The two low voltage value logic states on outputs 32 and 33 will switch transistors 49 and 52 of logic gate 40 into the "off" condition preventing any propagation of the erroneous logic states on outputs 19 and 20 of logic gate 12 from having an effect in logic gate 40.

Finally, a disturbance in logic gate 40 which results in there being a pair of high voltage level logic states on outputs 45 and 46 of logic gate 40 will result in both transistors 26 and 27 of logic gate 12 being switched into the "on" condition. This, in turn, will place each of outputs 19 and 20 of logic gate 12 in the low voltage value logic state. As described above, two low voltage value logic states applied to the inputs of inverter 29 will lead to that inverter not propagating such erroneous logic states any further. However, the low voltage value logic states on outputs 19 and 20 of logic gate 12 are also applied to inputs 42 and 41 of logic gate 40 which switches transistors 51 and 54 into the "off" condition. This would result in the correct logic states being provided from inverter 29, since it does not propagate the error of two low voltage value logic states being applied to its inputs, being ineffective in logic gate 40 because of the essentially open circuits occurring due to transistors 51 and 54 being in the "off" condition. However, this difficulty is overcome by providing transistors 50 and 53 which, through having the correct output logic states on inverter 29 provided on the inputs thereof, set the correct logic states into logic gate 40.

Although the present invention has been described with reference to preferred embodiments, workers skilled in the art will recognize that changes may be made in form and detail without departing from the spirit and scope of the invention.

What is claimed is:

1. A data storage latch sequential logic circuit having a latch first data signal input region, a latch first clock signal input region and a latch first output signal region, said circuit comprising:

a loop joining and access means having a first feedback signal input region and a first output region, and having said latch first data signal input region as its first data signal input region and having said latch first clock signal input region as its first enabling signal input region such that a logic value in an electrical signal on said latch first clock signal input region permits, if electrically energized, said loop joining and access means at its first output region to be capable of changing logic values in response to electrical signal changes on said latch first data signal input region but be incapable of changing logic values in response to electrical signal changes on said first feedback signal input region, and such that another logic value in such an electrical signal on said latch first clock signal input region permits said loop joining and access means at its first output region to be capable of changing logic values in response to electrical signal changes on said first feedback signal input region but be incapable of changing logic values in response to electrical signal changes on said latch first data signal input region;

an inverter means having a first input region and a first output region, said inverter means first input region being electrically connected to said loop joining and access means first output region, said inverter means first output region being electrically connected to said latch first output signal region; and a logic gate means having a first output region and having a first pair of input regions including first and second member input regions such that, for a pair of electrical signals one on each, there is a pair of concurrent logic values in these signals which will cause a change of logic values on said logic gate means first output region if said logic gate means is electrically energized, and other concurrent pairs of logic values in such pair of electrical signals which will cause an existing logic value on said logic gate means first output region to be maintained, said logic gate means first pair first and second member input regions being electrically connected to said loop joining and access means first output region and to said inverter means first output region, respectively, said logic gate means first output region being electrically connected to said loop joining and access means first feedback signal input region.

2. The apparatus of claim 1 wherein said circuit further has a latch second data signal input region, a latch second clock signal input region and a latch second output signal region; and wherein said loop joining and access means has a second feedback signal input region and a second output region, and has said latch second data signal input region serving as its second data signal input region and said latch second clock signal input region serving as its second enabling input signal region, said loop joining and access means being capable of providing logic signals on its second output region which are complementary to those provided on its first output region if electrical signals provided at said latch first clock signal input region are complementary to those provided at said latch second clock signal input region and if complementary signals are provided at each member of a selected one of that pair formed by said latch first and second data signal input regions and that pair formed by said first and second feedback signal input regions; said inverter means has a second input region and a second output region, said inverter means being capable of providing on its second output region logic values which are complementary to those provided on its first output region if that signal provided on its second input region is complementary to that provided on its first input region, said inverter means second input region being electrically connected to said loop joining and access means second output region, said inverter means second output region being electrically connected to said latch second output signal region; and said logic gate means having a second output region and having a second pair of input regions including first and second member input regions, said logic gate means being capable of providing changes in logic values on said logic gate means second output region which are complementary to those provided on said logic gate means first output region for said corresponding pair of concurrent logic values on said logic gate means first pair of first and second member input regions, as aforesaid, if a complementary pair of concurrent logic values are provided in electrical signals on corresponding ones of said logic gate means second pair first and second member input regions, said logic gate means second pair of first and second member input regions being electrically connected to said loop joining and access means second output region and to said inverter means second output region, respectively, said logic gate means second output region being electrically connected to said loop joining and access means second feedback signal input region.

3. The apparatus of claim 2 wherein said loop joining and access means further comprises:

a loop plural state circuit means having a plurality of terminating regions, including loop plural state circuit means first and second terminating regions, at each of which a plurality of voltage value states can be caused to alternatively occur, if said loop plural state circuit means is electrically energized, by establishing at least temporarily a low impedance circuit path from a selected one to a selected terminating region adapted for electrical connection to a selected voltage supply, but with each of said loop plural state circuit means first and second terminating regions being in voltage value states different from one another if free of other kinds of voltage value disturbances sufficient to cause a voltage value state change, and said loop plural state circuit means having a third terminating region adapted for electrical connection to a first voltage supply means, said loop plural state circuit means first and second terminating regions together serving as said loop joining and access means first and second output regions, respectively;

first and second loop common circuit means each having an input region and each having a plurality of terminating regions including first and second terminating regions, said first and second loop common circuit means second terminating regions each adapted for electrical connection to a second voltage supply means, each of said first and second loop common circuit means being capable of establishing at least one low impedance circuit path between its said first and second terminating regions as a result of a signal applied to its input region, said first and second loop common circuit means input regions together serving as said latch first and second clock signal input regions, respectively;

first and second loop data input circuit means each having an input region together serving as said latch first and second data signal input regions, respectively, and each having first and second terminating regions, said first loop data input circuit means first terminating region being electrically connected to said loop plural state circuit means first terminating region and said second loop data input circuit means first terminating region being electrically connected to said loop plural state circuit means second terminating region, said first and second loop data input circuit means second terminating regions each being electrically connected to said first loop common circuit means first terminating region, said first and second loop data input circuit means, if electrically energized, each being capable of receiving electrical signals at its said input region and, in response, of establishing at least one low impedance circuit path between its first and second terminating regions for a logic state therein and to respond to another logic state of such electrical signals to establish only relatively high impedance circuit paths between its first and second terminating regions; and first and second loop feedback input circuit means each having an input region together serving as said first and second feedback signal input regions, respectively, and each having first and second terminating regions, said first loop feedback input circuit means first terminating region being electrically connected to said loop plural state circuit means first terminating region and said second loop feedback input circuit means first terminating region being electrically connected to said loop plural state circuit means second terminating region, said first and second loop feedback input circuit means second terminating regions each being electrically connected to said second loop common circuit means first terminating region, said first and second loop feedback input circuit means, if electrically energized, each being capable of receiving electrical signals at its said input region and, in response, of establishing at least one low impedance circuit path between its first and second terminating regions for a logic state therein and to respond to another logic state of such electrical signals to establish only relatively high impedance circuit paths between its first and second terminating regions.

4. The apparatus of claim 2 wherein said inverter means further comprises:

an inverter plural state circuit means having a plurality of terminating regions, including inverter plural state circuit means first and second terminating regions, at each of which a plurality of voltage value states can be caused to alternatively occur, if said inverter plural state circuit means is electrically energized, by establishing at least temporarily a low impedance circuit path from a selected one to a selected terminating region adapted for electrical connection to a selected voltage supply, but with each of said inverter plural state circuit means first and second terminating regions being in voltage value states different from one another if free of other kinds of voltage value disturbances sufficient to cause a voltage value state change, and said inverter plural state circuit means having a third terminating region adapted for electrical connection to a first voltage supply means, said inverter plural state circuit means first and second terminating regions together serving as said inverter means first and second output regions, respectively;

an inverter designated control circuit means having an input region serving as said inverter means first input region, and having first and second terminating regions, said inverter designated control circuit means first terminating region being electrically connected to said inverter plural state means first terminating region, said inverter designated control circuit means second terminating region adapted for electrical connection to a second voltage supply means, said inverter designated control circuit means, if electrically energized, being capable of receiving electrical signals at said inverter designated control circuit input region and, in response, of establishing at least one low impedance path between said inverter designated control circuit means first and second terminating regions for a logic state therein and to respond to another logic state of such electrical signals to establish only relatively high impedance circuit paths between said inverter designated control circuit means first and second terminating regions; and an inverter complement circuit means having an input region serving as said inverter means second input region, and having first and second terminating regions, said inverter complement circuit means first terminating region being electrically connected to said inverter plural state means second terminating region, said inverter complement circuit means second terminating region adapted for electrical connection to said second voltage supply means, said inverter complement circuit means, if electrically energized, being capable of receiving electrical signals at said inverter complement circuit input region and, in response, of establishing at least one low impedance path between said inverter complement circuit means first and second terminating regions for a logic state therein and to respond to another logic state of such electrical signals to establish only relatively high impedance circuit paths between said inverter complement circuit means first and second terminating regions; and 5. The apparatus of claim 1 wherein said logic gate means further comprises:

a gate plural state circuit means having a plurality of terminating regions, including gate plural state circuit means first and second terminating regions, at each of which a plurality of voltage value states can be caused to alternatively occur, if said gate plural state circuit means is electrically energized, by establishing at least temporarily a low impedance circuit path from a selected one to a selected terminating region adapted for electrical connection to a selected voltage supply, but with each of said gate plural state circuit means first and second terminating regions being in voltage value states different from one another if free of other kinds of voltage value disturbances sufficient to cause a voltage value state change, and said gate plural state circuit means having a third terminating region adapted for electrical connection to a first voltage supply means, said gate plural state circuit means first and second terminating regions together serving as said logic gate means first and second output regions, respectively;

a gate designated control circuit means having first and second input regions serving as said logic gate means first pair first and second member input regions, respectively, and having first and second terminating regions, said gate designated control circuit means first terminating region being electrically connected to said gate plural state circuit means first terminating region, said gate designated control circuit means second terminating region adapted for electrical connection to a second voltage supply means, said gate designated control circuit means, if electrically energized, being capable of receiving electrical signals at said gate designated control circuit first and second input regions and, in response to said corresponding pair of concurrent logic values therein, of establishing at least one low impedance circuit path between said gate designated control circuit means first and second terminating regions and to respond to other concurrent pairs of logic values in such electrical signals to establish only relatively high impedance circuit paths between said gate designated control circuit means first and second terminating regions; and a gate complement control circuit means having first and second input regions serving as said logic gate means second pair first and second member input regions, respectively, and having first and second terminating regions, said gate complement control circuit means first terminating region being electrically connected to said gate plural state circuit means second terminating region, said gate complement control circuit means second terminating region adapted for electrical connection to said second voltage supply means, said gate complement control circuit means, if electrically energized, being capable of receiving electrical signals at said gate complement control circuit first and second input regions and, in response to said corresponding pair of concurrent logic values therein, of establishing at least one low impedance circuit path between said gate complement control circuit means first and second terminating regions and to respond to other concurrent pairs of logic values in such electrical signals to establish only relatively high impedance circuit paths between said gate complement control circuit means first and second terminating regions.

6. The apparatus of claim 3 wherein said inverter means further comprises:

an inverter plural state circuit means having a plurality of terminating regions, including inverter plural state circuit means first and second terminating regions, at each of which a plurality of voltage value states can be caused to alternatively occur, if said inverter plural state circuit means is electrically energized, by establishing at least temporarily a low impedance circuit path from a selected one to a selected terminating region adapted for electrical connection to a selected voltage supply, but with each of said inverter plural state circuit means first and second terminating regions being in voltage value states different from one another if free of other kinds of voltage value disturbances sufficient to cause a voltage value state change, and said inverter plural state circuit means having a third terminating region adapted for electrical connection to said first voltage supply means, said inverter plural state circuit means first and second terminating regions together serving as said inverter means first and second output regions, respectively;

an inverter designated control circuit means having an input region serving as said inverter means first input region, and having first and second terminating regions, said inverter designated control circuit means first terminating region being electrically connected to said inverter plural state means first terminating region, said inverter designated control circuit means second terminating region adapted for electrical connection to said second voltage supply means, said inverter designated control circuit means, if electrically energized, being capable of receiving electrical signals at said inverter designated control circuit input region and, in response, of establishing at least one low impedance path between said inverter designated control circuit means first and second terminating regions for a logic state therein and to respond to another logic state of such electrical signals to establish only relatively high impedance circuit paths between said inverter designated control circuit means first and second terminating regions; and an inverter complement circuit means having an input region serving as said inverter means second input region, and having first and second terminating regions, said inverter complement circuit means first terminating region being electrically connected to said inverter plural state means second terminating region, said inverter complement circuit means second terminating region adapted for electrical connection to said second voltage supply means, said inverter complement circuit means, if electrically energized, being capable of receiving electrical signals at said inverter complement circuit input region and, in response, of establishing at least one low impedance path between said inverter complement circuit means first and second terminating regions for a logic state therein and to respond to another logic state of such electrical signals to establish only relatively high impedance circuit paths between said inverter complement circuit means first and second terminating regions.

7. The apparatus of claim 3 wherein said loop plural state circuit means comprises first and second switching devices where such a switching device has first and second terminating regions and a control region therein by which such switching device is capable of being directed, through electrical energization thereof, to effectively provide a conductive path of a selected conductivity between its first and second terminating regions, said first and second switching device first terminating regions together comprising said loop plural state circuit means third terminating region, said first switching device control region and said second switching device second terminating region together comprise said loop plural state circuit means second terminating region, and said first switching device second terminating region and said second switching device control region together comprise said loop plural state circuit means first terminating region; wherein said loop first common circuit means comprises a switching device with a control region serving as said loop first common circuit means input region, a first terminating region serving as said loop first common circuit means first terminating region, and a second terminating region serving as said loop first common circuit means second terminating region; wherein said loop second common circuit means comprises a switching device with a control region serving as said loop second common circuit means input region, a first terminating region serving as said loop second common circuit means first terminating region, and a second terminating region serving as said loop second common circuit means second terminating region; wherein said loop first data input circuit means comprises a switching device having a control region serving as said loop first data input circuit means input region, a first terminating region serving as said loop first data input circuit means first terminating region, and a second terminating region serving as said loop first data input circuit means second terminating region; wherein said loop second data input circuit means comprises a switching device having a control region serving as said loop second data input circuit means input region, a first terminating region serving as said loop second data input circuit means first terminating region, and a second terminating region serving as said loop second data input circuit means second terminating region; wherein said loop first feedback input circuit means comprises a switching device having a control region serving as said loop first feedback input circuit means input region, a first terminating region serving as said loop first feedback input circuit means first terminating region, and a second terminating region serving as said loop first feedback input circuit means second terminating region; and wherein said loop second feedback input circuit means comprises a switching device having a control region serving as said loop second feedback input circuit means input region, a first terminating region serving as said loop second feedback input circuit means first terminating region, and a second terminating region serving as said loop second feedback input circuit means second terminating region.

8. The apparatus of claim 4 wherein said logic gate means further comprises:
a gate plural state circuit means having a plurality of terminating regions, including gate plural state circuit means first and second terminating regions, at each of which a plurality of voltage value states can be caused to alternatively occur, if said gate plural state circuit means is electrically energized, by establishing at least temporarily a low impedance circuit path from a selected one to a selected terminating region adapted for electrical connection to a selected voltage supply, but with each of said gate plural state circuit means first and second terminating regions being in voltage value states different from one another if free of other kinds of voltage value disturbances sufficient to cause a voltage value state change, and said gate plural state circuit means having a third terminating region adapted for electrical connection to said first voltage supply means, said gate plural state circuit means first and second terminating regions together serving as said logic gate means first and second output regions, respectively;
a gate designated control circuit means having first and second input regions serving as said logic gate means first pair first and second member input regions, respectively, and having first and second terminating regions, said gate designated control circuit means first terminating region being electrically connected to said gate plural state circuit means first terminating region, said gate designated control circuit means second terminating region adapted for electrical connection to said second voltage supply means, said gate designated control circuit means, if electrically energized, being capable of receiving electrical signals at said gate designated control circuit first and second input regions and, in response to said corresponding pair of concurrent logic values therein, of establishing at least one low impedance circuit path between said gate designated control circuit means first and second terminating regions and to respond to other concurrent pairs of logic values in such electrical signals to establish only relatively high impedance circuit paths between said gate designated control circuit means first and second terminating regions; and
a gate complement control circuit means having first and second input regions serving as said logic gate means second pair first and second member input regions, respectively, and having first and second terminating regions, said gate complement control circuit means first terminating region being electrically connected to said gate plural state circuit means second terminating region, said gate complement control circuit means second terminating region adapted for electrical connection to said second voltage supply means, said gate complement control circuit means, if electrically energized, being capable of receiving electrical signals at said gate complement control circuit first and second input regions and, in response to said corresponding pair of concurrent logic values therein, of establishing at least one low impedance circuit path between said gate complement control circuit means first and second terminating regions and to respond to other concurrent pairs of logic values in such electrical signals to establish only relatively high impedance circuit paths between said gate complement control circuit means first and second terminating regions.

9. The apparatus of claim 4 wherein said inverter plural state circuit means comprises first and second switching devices where such a switching device has first and second terminating regions and a control region therein by which such switching device is capable of being directed, through electrical energization thereof, to effectively provide a conductive path of a selected conductivity between its first and second terminating regions, said first and second switching device first terminating regions together comprising said inverter plural state circuit means third terminating region, said first switching device control region and said second switching device second terminating region together comprise said inverter plural state circuit means second terminating region, and said first switching device second terminating region and said second switching device control region together comprise said inverter plural state circuit means first terminating region; wherein said inverter designated control circuit means further comprises a switching means having a control region serving as said inverter designated control circuit means input region, a first terminating region serving as said inverter designated control circuit means first terminating region, and a second terminating region serving as said inverter designated control circuit means second terminating region; and wherein said inverter complement control circuit means further comprises a switching means having a control region serving as said inverter complement control circuit means input region, a first terminating region serving as said inverter complement control circuit means first terminating region, and a second terminating region serving as said inverter complement control circuit means second terminating region.

10. The apparatus of claim 5 wherein said loop joining and access means further comprises:

a loop plural state circuit means having a plurality of terminating regions, including loop plural state circuit means first and second terminating regions, at each of which a plurality of voltage value states can be caused to alternatively occur, if said loop plural state circuit means is electrically energized, by establishing at least temporarily a low impedance circuit path from a selected one to a selected terminating region adapted for electrical connection to a selected voltage supply, but with each of said loop plural state circuit means first and second terminating regions being in voltage value states different from one another if free of other kinds of voltage value disturbances sufficient to cause a voltage value state change, and said loop plural state circuit means having a third terminating region adapted for electrical connection to said first voltage supply means, said loop plural state circuit means first and second terminating regions together serving as said loop joining and access means first and second output regions, respectively;

first and second loop common circuit means each having an input region and each having a plurality of terminating region, including first and second terminating regions, said first and second loop common circuit means second terminating regions each adapted for electrical connection to said second voltage supply means, each of said first and second loop common circuit means being capable of establishing at least one low impedance circuit path between its said first and second terminating regions as a result of a signal applied to its input region, said first and second loop common circuit means input regions together serving as said latch first and second clock signal input regions, respectively;

first and second loop data input circuit means each having an input region together serving as said latch first and second data signal input regions, respectively, and each having first and second terminating regions, said first loop data input circuit means first terminating region being electrically connected to said loop plural state circuit means first terminating region and said second loop data input circuit means first terminating region being electrically connected to said loop plural state circuit means second terminating region, said first and second loop data input circuit means second terminating regions each being electrically connected to said first loop common circuit means first terminating region, said first and second loop data input circuit means, if electrically energized, each being capable of receiving electrical signals at its said input region and, in response, of establishing at least one low impedance circuit path between its first and second terminating regions for a logic state therein and to respond to another logic state of such electrical signals to establish only relatively high impedance circuit paths between its first and second terminating regions; and first and second loop feedback input circuit means each having an input region together serving as said first and second feedback signal input regions, respectively, and each having first and second terminating regions, said first loop feedback input circuit means first terminating region being electrically connected to said loop plural state circuit means first terminating region and said second loop feedback input circuit means first terminating region being electrically connected to said loop plural state circuit means second terminating region, said first and second loop feedback input circuit means second terminating regions each being electrically connected to said second loop common circuit means first terminating region, said first and second loop feedback input circuit means, if electrically energized, each being capable of receiving electrical signals at its said input region and, in response, of establishing at least one low impedance circuit path between its first and second terminating regions for a logic state therein and to respond to another logic state of such electrical signals to establish only relatively high impedance circuit paths between its first and second terminating regions.

11. The apparatus of claim 5 wherein said gate plural state circuit means comprises first and second switching devices where such a switching device has first and second terminating regions and a control region therein by which such switching device is capable of being directed, through electrical energization thereof, to effectively provide a conductive path of a selected conductivity between its first and second terminating regions, said first and second switching device first terminating regions together comprising said gate plural state circuit means third terminating region, said first switching device control region and said second switching device second terminating region together comprise said gate plural state circuit means second terminating region, and said first switching device second terminating region and said second switching device control region together comprise said gate plural state circuit means first terminating region; wherein said gate designated control circuit means further comprises first, second and third switching devices, said first and third switching device first terminating regions together serving as said gate designated control circuit means first terminating region, said first and third switching device control regions together serving as said gate designated control circuit means first input region, said second and third switching device second terminating regions together serving as said gate designated control circuit means second terminating region, said second switching device control region serving as said gate designated control circuit means second input region, and said first switching device second terminating region being electrically connected to said second switching device first terminating region; and wherein said gate complement control circuit means further comprises first, second and third switching devices, said first and third switching device first terminating regions together serving as said gate complement control circuit means first terminating region, said first and third switching device control regions together serving as said gate complement control circuit means first input region, said second and third switching device second terminating regions together serving as said gate complement control circuit means second terminating region, said second switching device control region serving as said gate complement control circuit means second input region, and said first switching device second terminating region being electrically connected to said second switching device first terminating region.

12. The apparatus of claim 6 wherein any said low impedance circuit path established in any of said loop first and second data input circuit means and said loop first and second feedback input circuit means is of a sufficiently low impedance so that any circuit current that can be supplied therealong through said loop plural state circuit means, if electrically energized, will cause a voltage drop along such circuit path that is smaller in absolute value than that of threshold values associated with a corresponding one of said inverter means first and second input regions which must be passed in value by signals thereon to have such signals given effect in said inverter means, and smaller than that of threshold values associated with a corresponding one of said logic gate means first pair second member and second pair second member input regions which must be passed in value by signals thereon to have such signals given effect in said logic gate means.

13. The apparatus of claim 7 wherein said switching devices are each a transistor.

14. The apparatus of claim wherein any said low impedance circuit path established in either of said inverter designated circuit means and said inverter complement circuit means is of a sufficiently low impedance so that any circuit current that can be supplied therealong through said inverter plural state circuit means, if electrically energized, will cause a voltage drop along such circuit path that is smaller in absolute value than that of threshold values associated with a corresponding one of said logic gate means first pair first member and second pair first member input regions which must be passed in value by signals thereon to have such signals given effect in said logic gate means.

15. The apparatus of claim 9 wherein said switching devices are each a transistor.

16. The apparatus of claim 10 wherein any said low impedance circuit path established in either of said gate designated circuit means and said gate complement circuit means, excepting one such low impedance path in each, is of a sufficiently low impedance so that any circuit current that can be supplied therealong through said gate plural state circuit means, if electrically energized, will cause a voltage drop along such circuit path that is smaller in absolute value than that of threshold values associated with a corresponding one of said loop joining and access means first and second feedback signal input regions which must be passed in value by signals thereon to have such signals given effect in causing inversion of logic values appearing on said inverter means first and second output regions.

17. The apparatus of claim 10 wherein any said low impedance circuit path established in any of said loop first feedback input circuit means and said loop second feedback input circuit means is of a sufficiently low impedance so that any circuit current that can be supplied therealong through said loop plural state circuit means, if electrically energized, will cause a voltage drop along such circuit path that is smaller in absolute value than that of a threshold value associated with a corresponding one of said inverter means first and second input regions as necessary to have such signals given effect in causing inversion of logic values appearing on said inverter means first and second output regions.

18. The apparatus of claim 11 wherein said switching devices are each a transistor.

19. The apparatus of claim 13 wherein said loop plural state circuit means first and second switching devices are each a p-channel MOSFET, and each of those switching devices remaining is a n-channel MOSFET.

20. The apparatus of claim 15 wherein said inverter plural state circuit means first and second switching devices are each a p-channel MOSFET, and each of those switching devices remaining is a n-channel MOSFET.

21. The apparatus of claim 17 wherein said gate plural state circuit means first and second switching devices are each a p-channel MOSFET, and each of those switching devices remaining is a n-channel MOSFET.

* * * * *

UNITED STATES PATENT AND TRADEMARK OFFICE
CERTIFICATE OF CORRECTION

PATENT NO.    : 4937473

DATED         : 06/26/90

INVENTOR(S)   : TIMOTHY V. STATZ, ET AL.

It is certified that error appears in the above-identified patent and that said Letters Patent is hereby corrected as shown below:

Column 25, line 55, after "claim" insert --8--.

Signed and Sealed this

Seventeenth Day of September, 1991

Attest:

HARRY F. MANBECK, JR.

*Attesting Officer*           *Commissioner of Patents and Trademarks*